(12) United States Patent
Min et al.

(10) Patent No.: US 10,064,291 B2
(45) Date of Patent: Aug. 28, 2018

(54) CIRCUIT BOARD AND MANUFACTURING METHOD THEREOF

(71) Applicant: Samsung Electro-Mechanics Co., Ltd., Suwon-Si (KR)

(72) Inventors: Tae-Hong Min, Hwaseong-si (KR); Myung-Sam Kang, Hwaseong-si (KR); Young-Gwan Ko, Seoul (KR); Min-Jae Seong, Mungyeong-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 148 days.

(21) Appl. No.: 14/981,378

(22) Filed: Dec. 28, 2015

(65) Prior Publication Data

US 2016/0192471 A1 Jun. 30, 2016

(30) Foreign Application Priority Data

Dec. 29, 2014 (KR) .......................... 10-2014-0192223

(51) Int. Cl.
*H05K 1/02* (2006.01)
*H05K 1/18* (2006.01)
*H05K 3/46* (2006.01)

(52) U.S. Cl.
CPC ......... *H05K 3/4602* (2013.01); *H05K 1/0203* (2013.01); *H05K 1/0206* (2013.01); *H05K 1/0207* (2013.01); *H05K 1/181* (2013.01); *H05K 1/185* (2013.01)

(58) Field of Classification Search
CPC .. H05K 1/0203; H05K 1/0206; H05K 1/2017; H05K 1/181
See application file for complete search history.

(56) References Cited

U.S. PATENT DOCUMENTS

| | | | | |
|---|---|---|---|---|
| 8,704,101 | B2* | 4/2014 | Sun | H01L 23/3677 174/252 |
| 8,908,383 | B1* | 12/2014 | Railkar | H05K 1/0206 361/704 |
| 9,655,229 | B2* | 5/2017 | Min | H05K 1/0206 |
| 9,698,089 | B2* | 7/2017 | Brunschwiler | H05K 1/0206 |
| 9,699,885 | B2* | 7/2017 | Min | H05K 1/0206 |
| 9,788,409 | B2* | 10/2017 | Lee | H05K 1/0206 |
| 2003/0169575 | A1* | 9/2003 | Ikuta | H01L 23/3677 361/761 |
| 2006/0081396 | A1* | 4/2006 | Hsu | H05K 1/115 174/255 |
| 2007/0243402 | A1* | 10/2007 | Sato | H05K 3/386 428/606 |
| 2008/0019097 | A1* | 1/2008 | Zhang | F28F 13/00 361/704 |
| 2014/0041907 | A1* | 2/2014 | Kim | H05K 1/0204 174/252 |

(Continued)

*Primary Examiner* — Nathan Milakovich
(74) *Attorney, Agent, or Firm* — NSIP Law

(57) ABSTRACT

A circuit board and a method of manufacturing the same are disclosed. The circuit board includes an insulating part, a thermally conductive structure comprising a first structure and a second structure, and an insulator configured to insulate the first structure from the second structure, wherein the first structure and the second structure are composed of thermally conductive material, and at least a part of the thermally conductive structure is inserted to the insulating part.

8 Claims, 10 Drawing Sheets

(56) References Cited

U.S. PATENT DOCUMENTS

| | | | | |
|---|---|---|---|---|
| 2014/0061692 A1* | 3/2014 | Preuschl | ............. | H05K 1/0206 257/91 |
| 2014/0144677 A1* | 5/2014 | Wang | ................... | H05K 1/0206 174/252 |
| 2014/0355215 A1* | 12/2014 | Canete | .................... | H05K 3/30 361/720 |
| 2015/0271915 A1* | 9/2015 | Hsu | ...................... | H05K 1/0271 361/767 |
| 2016/0095201 A1* | 3/2016 | Min | .................... | H05K 1/0204 361/709 |
| 2016/0095203 A1* | 3/2016 | Min | .................... | H05K 1/0207 361/690 |
| 2016/0249445 A1* | 8/2016 | Min | .................... | H05K 1/0203 |
| 2016/0302298 A1* | 10/2016 | Min | .................... | H05K 1/0204 |
| 2017/0251548 A1* | 8/2017 | Min | .................... | H05K 1/0206 |

\* cited by examiner

CIRCUIT BOARD AND MANUFACTURING METHOD THEREOF

CROSS REFERENCE TO RELATED APPLICATION(S)

This application claims the benefit under 35 USC § 119(a) of Korean Patent Application No. 10-2014-0192223, filed on Dec. 29, 2014, with the Korean Intellectual Property Office, the entire disclosure of which is incorporated herein by reference for all purposes.

BACKGROUND

1. Field

The following description relates to a circuit board and a method for manufacturing the same.

2. Description of Related Art

Multilayer board technologies, which form wiring layers in circuit boards such as printed circuit boards have been developed in response to demands for electronic devices with lighter weights, smaller sizes, faster speeds, greater capabilities, and higher performances. Technologies that mount electronic elements, such as active elements or passive elements, in multilayer boards have also been developed. However, application processors with multi-functions and high performances which are connected to the multilayer boards cause significant increase of heat of circuits of PCBs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect there is provided a circuit board, which provides improved heat-releasing performance, provides lighter, thinner, shorter and smaller circuits, improves reliability, reduces noises, and increases manufacturing efficiency.

A circuit board according to an embodiment of the present disclosure may include a thermally conductive structure and the thermally conductive structure may include a first structure and a second structure, which are insulated from each other by a structure insulating part.

In another general aspect there is provided a circuit board including an insulating part, a thermally conductive structure including a first structure and a second structure, and an insulator configured to insulate the first structure from the second structure, wherein the first structure and the second structure are composed of thermally conductive material, and at least a part of the thermally conductive structure is inserted to the insulating part.

The adhesive part may be composed of a primer including acrylic silane.

The insulator may comprise glass fiber.

The circuit board may including a first contact via configured to contact with an upper surface of the first structure, a second contact via configured to contact with an upper surface of the second structure, a third contact via configured to contact with a lower surface of the first structure, and a fourth contact via configured to contact with a lower surface of the second structure.

The circuit board may include a first signal transmission path comprising the first contact via, the first structure, and the third contact via, a second signal transmission path comprising the second contact via, the second structure, and the fourth contact via, and the first signal transmission path and the second signal transmission path being insulated from each other.

The thermally conductive structure may be disposed adjacent to a hot spot.

The circuit board may include an electrical component disposed substantially vertically above the thermally conductive structure, and an area of an upper surface of the thermally conductive structure corresponds to an area of a hot spot of the electrical component.

In another general aspect there is provided a portion of a thermally conductive structure inserted in a cavity of a first insulating layer, a first conductive pattern formed on the upper surface of the first insulating layer, a second conductive pattern formed on the lower surface of the first insulating layer, a upper via formed on the upper part of the first insulating layer and passing through a second insulating layer, a lower via formed on the lower part of the first insulating layer and passing through a third insulating layer, a first contact pad formed on an external surface of the second insulating layer and contact to one end of the upper via, and a second contact pad formed on an external surface of the third insulating layer and contact to one end of the lower via, wherein the thermally conductive structure is formed by sequentially combining a first structure, a structure insulating part and a second structure in a direction perpendicular to the stacked direction of the second insulating layer, the first insulating layer and the third insulating layer, wherein an adhesive part is formed on a surface of the thermally conductive structure to increase adhesion between the thermally conductive structure and the second insulating layer and the third insulating layer.

The upper via may include a first via configured to contact with the first structure and a second via configured to contact with the second structure, and the lower via may include a third via configured to contact with the first structure and a fourth via configured to contact with the second structure.

The upper via and the lower via may pass through the adhesive part to contact the first structure and the second structure, respectively.

In another general aspect there is provided a method for manufacturing a circuit board including an insulating part, a thermally conductive structure comprising a first structure composed of thermally conductive material, a second structure composed of thermally conductive material, and an insulator configured to insulate the first structure from the second structure, the method including forming a base comprising a first metal layer on one surface of an insulating layer and a second metal layer on the other surface of the insulating layer, forming a thermally conductive structure by dicing the base in a predetermined size; and inserting at least a part of the thermally conductive structure in the insulating part.

A plurality of thermally conductive structures may be formed by the dicing of the base.

An adhesive part may be formed on a surface of the thermally conductive structure.

The thermally conductive structure may be arranged for an interface of the first structure and the structure insulating part or an interface of the second structure and the structure insulating part to be perpendicular to the upper surface or the lower surface of the circuit board.

The thermally conductive structure may be shaped as a column, and an upper and a lower surface of the columns may be shaped as squares.

Areas of the upper and the lower surface of the columns may be substantially equal.

Manufacturing efficiency may be increased while improving the heat releasing performance of the circuit board.

Other features and aspects will be apparent from the following detailed description, the drawings, and the claims.

Figure 1:
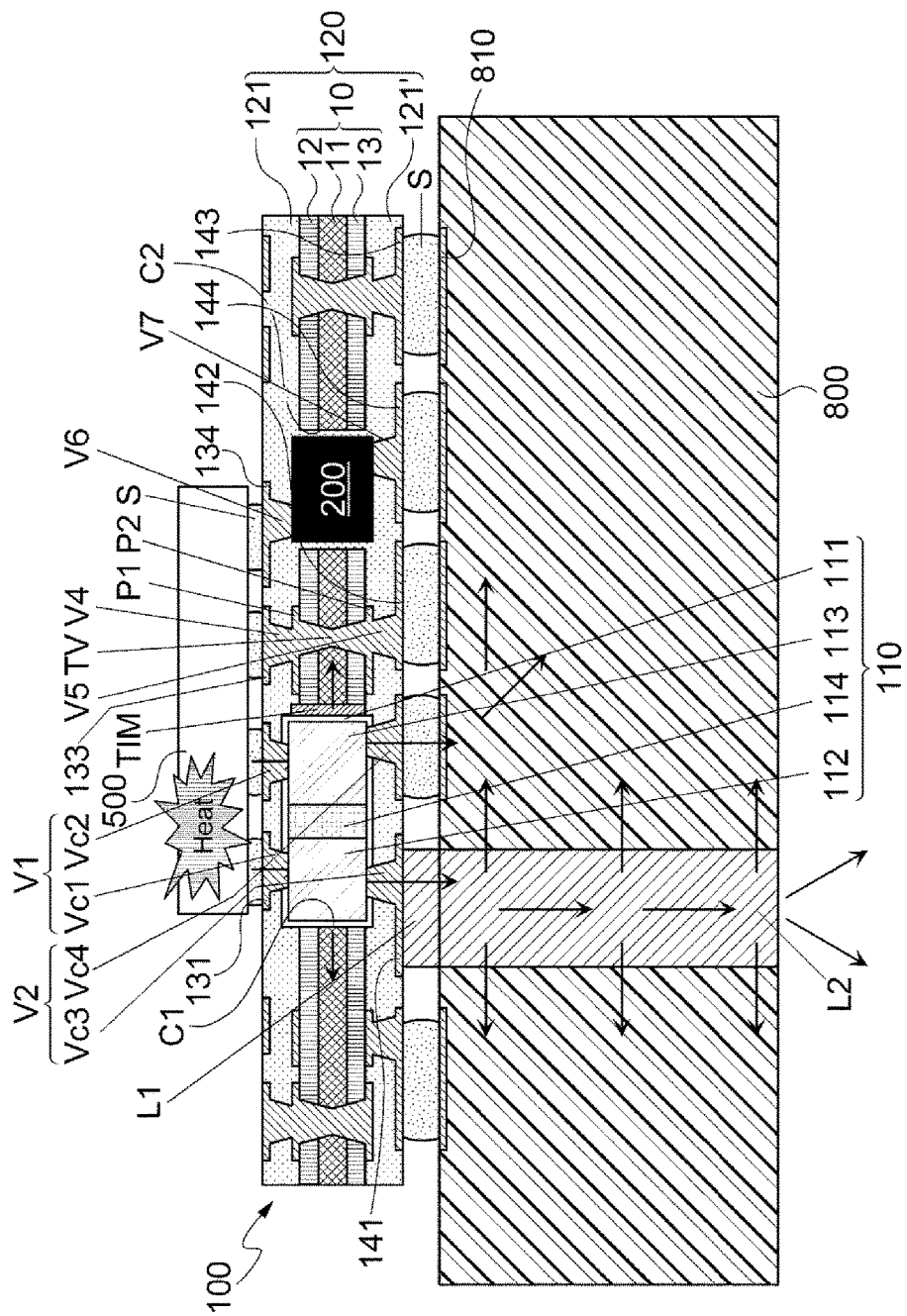
FIG. 1 is a diagram illustrating an example of a circuit board.

Throughout the drawings and the detailed description, unless otherwise described or provided, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations is described as an example; the sequence of operations is not limited to that set forth herein and may be changed as is known in the art, with the exception of steps and/or operations that necessarily occur in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure is thorough, complete, and conveys the full scope of the disclosure to one of ordinary skill in the art.

It will be understood that, although the terms "first," "second," "third," "fourth" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. Similarly, when it is described that a method includes series of steps, a sequence of the steps is not a sequence in which the steps should be performed in the sequence, an arbitrary technical step may be omitted and/or another arbitrary step, which is not disclosed herein, may be added to the method.

It will be understood that when terms "left," "light," "front," "rear," "on," "under," "over," "beneath" or the like are used, the terms are merely used for the purpose of description, not describing unchangeable relative positions. The terms used herein may be exchangeable to be operated in different directions than shown and described herein under an appropriate environment. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 2:
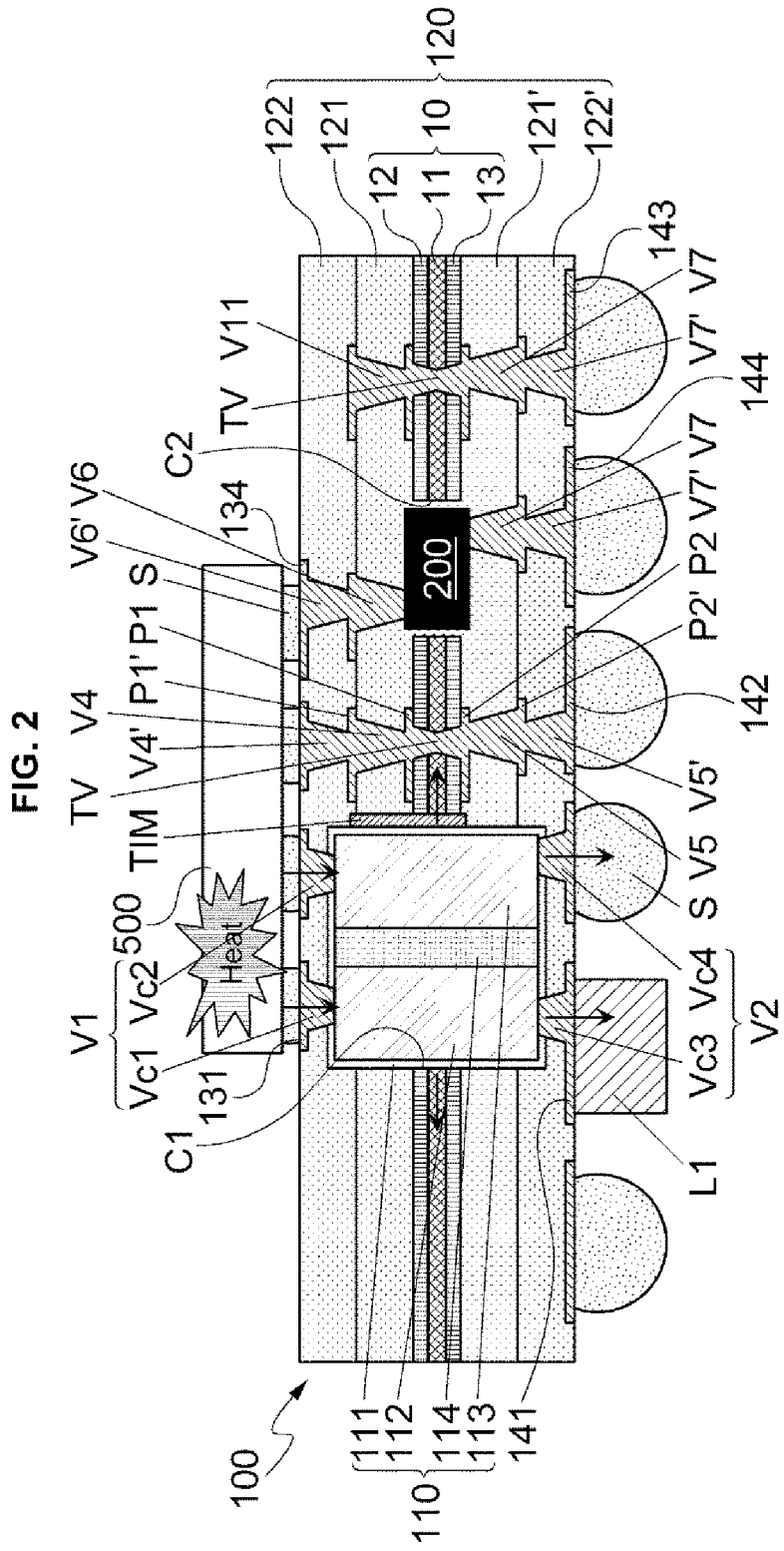
FIG. 2 is a diagram illustrating an example of a circuit board.
Figure 3:
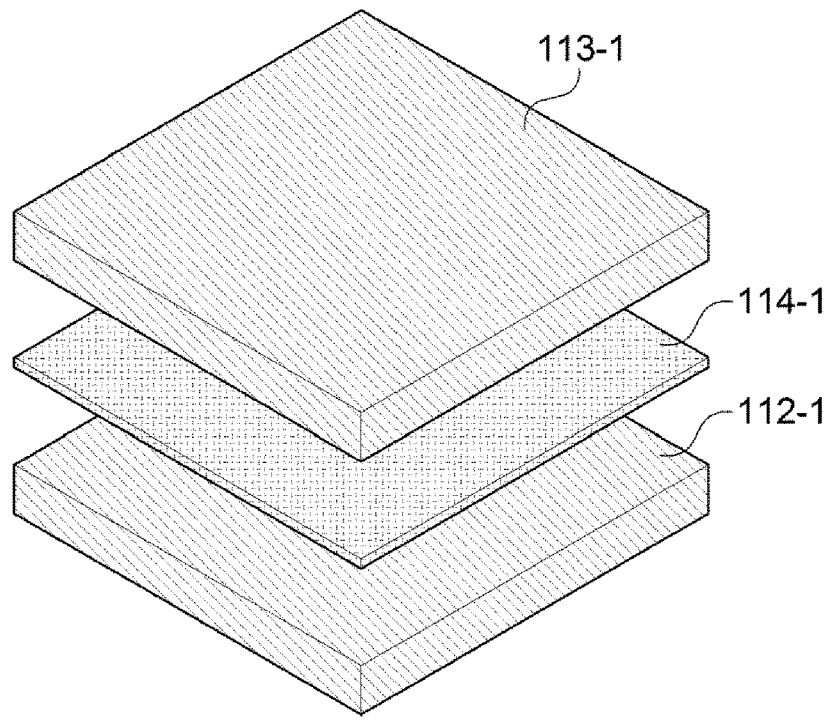
FIG. 3 is a diagram illustrating a part of a method for manufacturing a circuit board.
Figure 4:
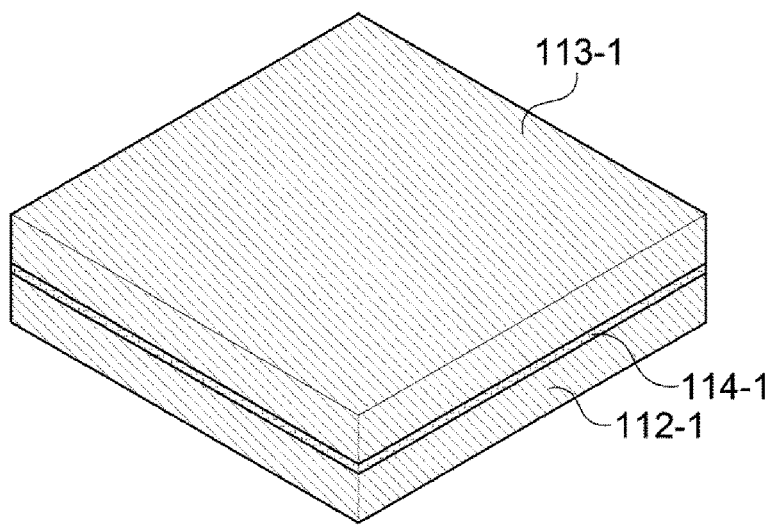
FIG. 4 is a diagram illustrating a part of a method for manufacturing a circuit board.
Figure 5:
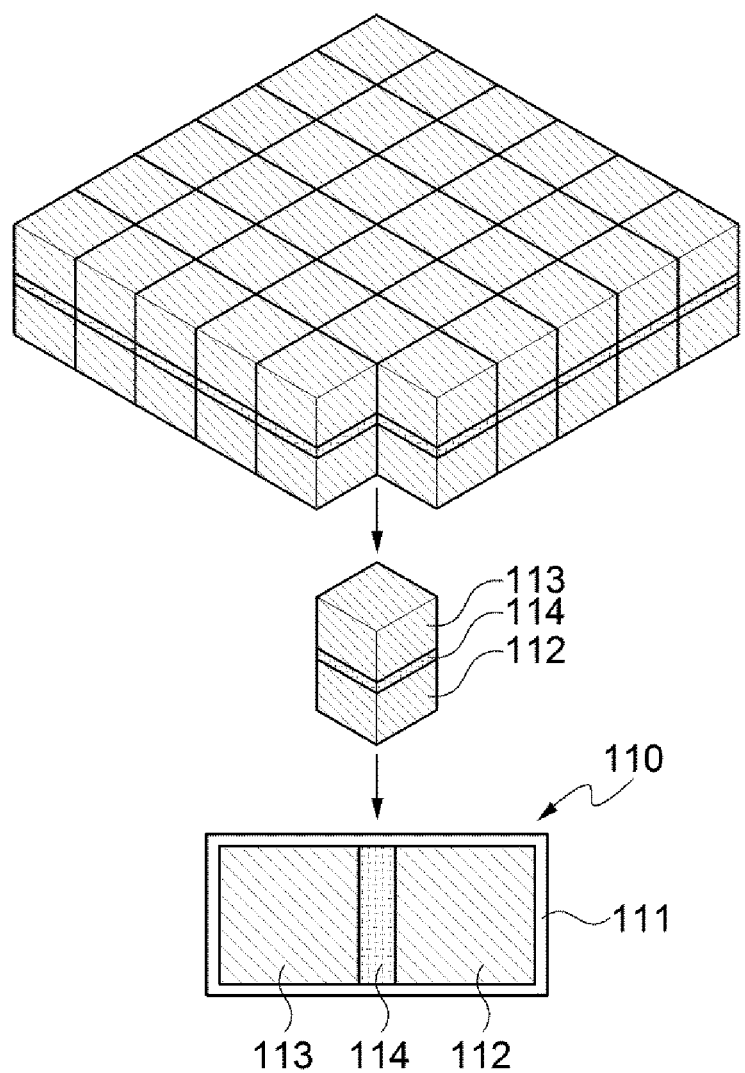
FIG. 5 is a diagram illustrating a part of a method for manufacturing a circuit board.
Figure 6:
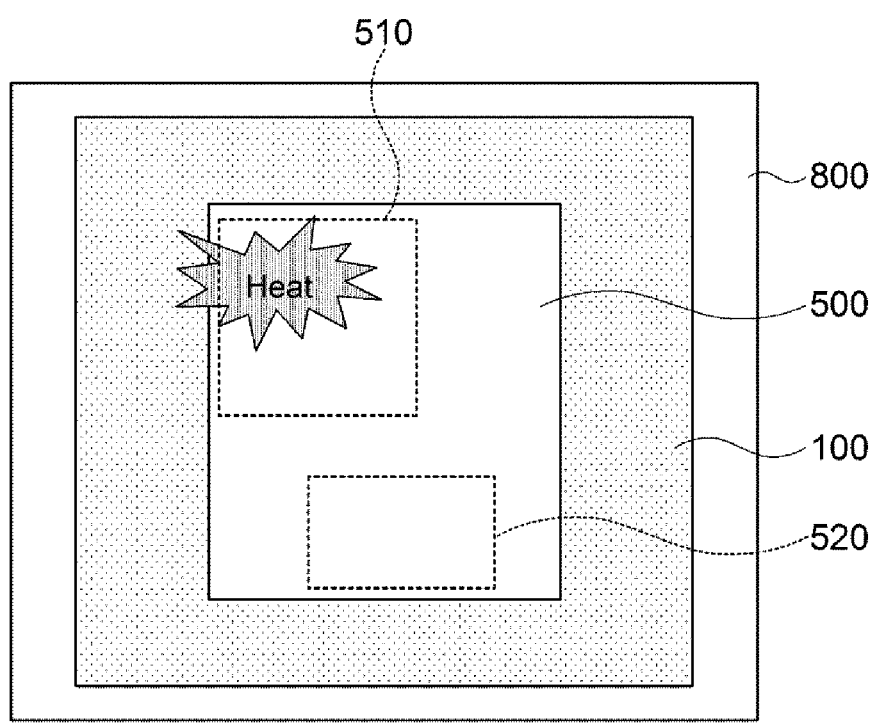
FIG. 6 is a diagram illustrating an example of a flat shape of a circuit board.
Figure 7:
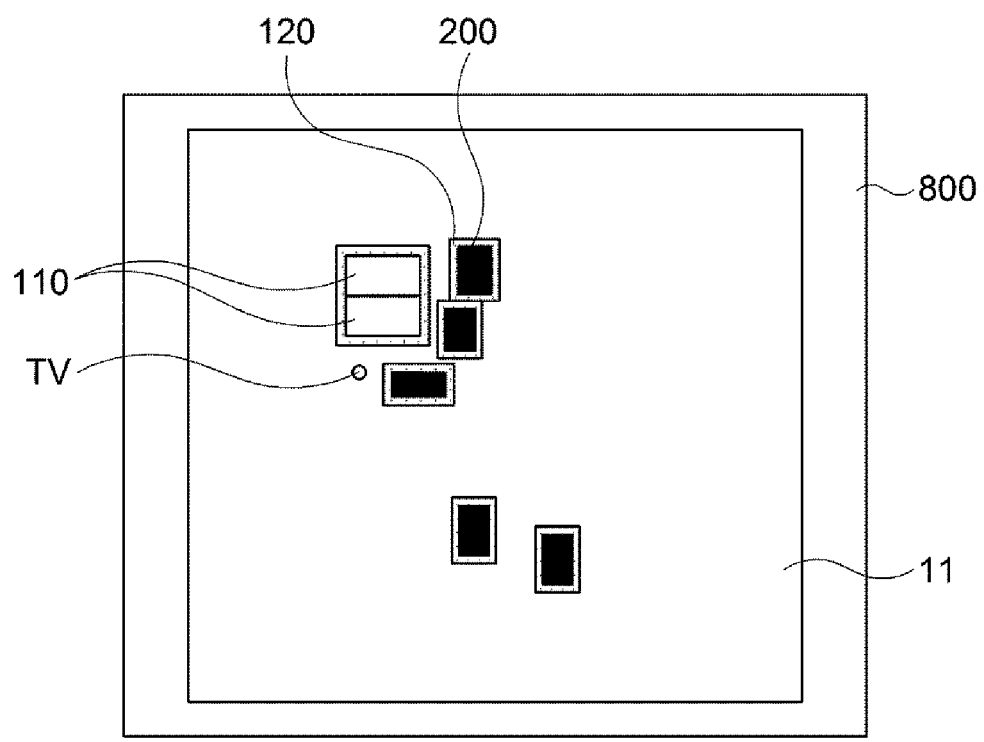
FIG. 7 is a horizontal sectional view illustrating an example of a circuit board.
Figure 8:
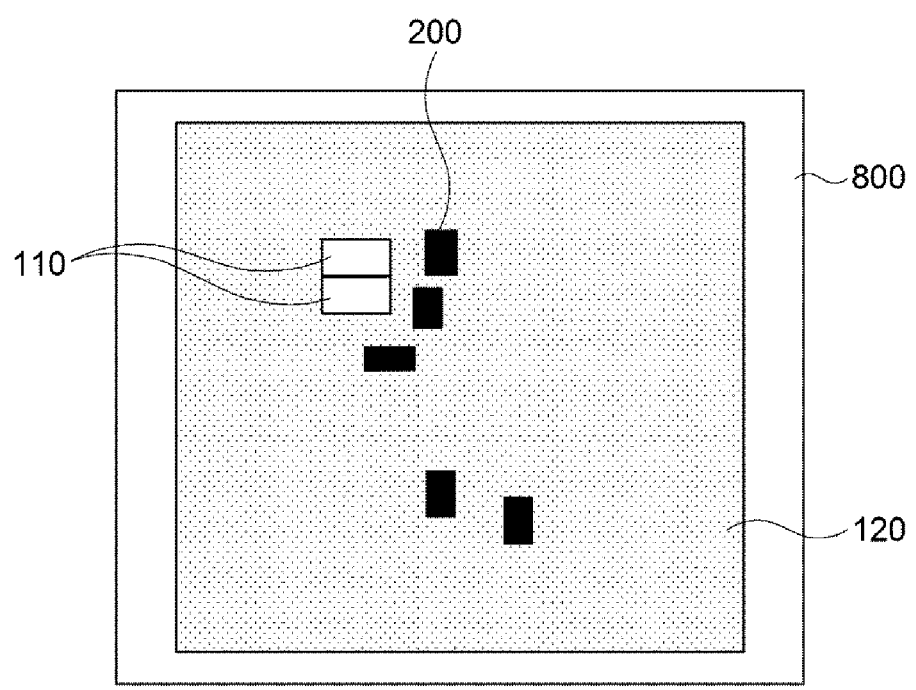
FIG. 8 is a horizontal sectional view illustrating an example of a circuit board.

FIG. 1 is a diagram illustrating an example of a circuit board 100. FIG. 2 is a diagram illustrating another example of a circuit board 100. FIG. 3 is a diagram illustrating a part of a method for manufacturing a circuit board. FIG. 4 is a diagram illustrating a part of a method for manufacturing a circuit board. FIG. 5 is a diagram illustrating a part of a method for manufacturing a circuit board. FIG. 6 is a diagram illustrating a flat shape of a circuit board 100. FIG. 7 is a horizontal sectional view illustrating an example of a circuit board 100. FIG. 8 is a horizontal sectional view illustrating an example of a circuit board 100.

A circuit board 100 according to an example may include a thermally conductive structure 110 and a part of the thermally conductive structure 110 may be inserted into an insulating part 120. In an example, the thermally conductive structure 110 may be composed of a material having high thermal conductivity. The thermally conductive structure 110 may be formed in a lump shape. In another example, the thermally conductive structure 110 may be formed in other shapes, such as, for example, a cylindrical or prismatic shape.

In an example, the insulating part 120 may be formed of one insulating layer or of a plurality of insulating layers. In FIG. 1, the insulating part 120 is formed of 3 insulating layers 10, 121, 121'. The center insulating layer may be called as a core 10.

In an example, the thermally conductive structure 110 may be located in the middle of the insulating part 120. As shown in FIG. 1, a cavity C1 may be formed in the core 10 and the thermally conductive structure 110 may be inserted in the cavity C1.

In an example, the thermally conductive structure 110 may include a first structure 112, a second structure 113, and a structure insulating part 114. The first structure 112 and the second structure 113 may be composed of a metallic material such as a copper material having high thermal and electrical conductivity. The structure insulating part 114 may be composed of a general insulating material. The structure insulating part 114 may also include a reinforcing material, such as glass fiber. The structure insulating part 114 may act as a dielectric material between the first structure 112 and the second structure 113. That is, the structure insulating part 114 may prevent cross-talk between electrical signals provided in the first structure 112 and electrical signals provided in the second structure 113. A primer layer 111 may be formed on the surface of the thermally conductive structure 110 to improve the adhesion with the insulating part 120.

Referring to FIG. 3 to FIG. 5, a method for manufacturing a circuit board may implement the thermally conductive structure 110 by forming metal layers on the both sides of the insulating layer.

This may allow for mass production of the thermally conductive structure using the insulating layer and the metal layers having a predetermined size. For example, the metal layer and the insulating layer may be in a sheet form with a relatively larger area compared to their thickness. The thermally conductive structure 110 including the first structure 112, the structure insulating part 114. The second structure 113 may be mass produced by dicing a structure including a first metal layer 112-1, an insulating layer 114-1, and a second metal layer 113-1. Here, the first metal layer 112-1 may be the first structure 112, the second metal layer 113-1 may be the second structure 113, and the insulating layer 114-1 may be the insulating layer 114 after the dicing process. The structure of the first metal layer 112-1, the insulating layer 114-1, and the second metal layer 113-1 may be prepared by plating the upper side and the lower side of the insulating layer 114-1. In addition, the insulating layer 114-1 may be formed on at least one of the first metal layer 112-1 or the second metal layer 113-1 which is a pre-prepared sheet and the other metal layer may be then formed using the plating process.

In an example, vias may be formed in the insulating part 120 and be in contact with the thermally conductive structure 110. Vias that are formed in the upper part of the thermally conductive structure 110 may be called as first vias V1 and those in the lower may be called as second vias V2. A via that is in contact with the first structure 112 among the first vias V1 may be called as a first contact via Vc1. A via that is in contact with the second structure 113 may be called as a second contact via Vc2. A via that is in contact with the first structure 112 among the second vias V2 may be called as a third contact via Vc3 and a via that is in contact with the second structure 113 may be called as a fourth contact via Vc4.

At least one metal pattern may be formed on the insulating part 120. A metal pattern that is in contact with the first via V1 may be called as a first metal pattern 131 and that in contact with the second via V2 may be called as a second metal pattern 141. A fourth via V4 and a fifth via V5 may be also formed in the insulating part 120. A metal pattern in contact with one end of the fourth via V4 may be called as a third metal pattern 133 and that in contact with the other end of the fifth via V5 may be called as a fourth metal pattern 142.

In an example, the thermally conductive structure 110 may hold heat, and the ability of the thermally conductive structure 110 to hold heat varies proportionally with its volume. As shown in FIG. 1, the thermally conductive structure 110 may be formed in a column shape. Volume of the thermally conductive structure 110 may be maximized when the lower areas of the columns are equal. When the upper part and the lower part of the thermally conductive structure 110 are formed in a polygon shape, particularly in a square shape, it may satisfy more current trends of being smaller size and finer pattern pitch, compared with the upper part and the lower part of the thermally conductive structure 110 being formed in a round or oval shape.

Volume of the thermally conductive structure 110 is much larger than that of vias such as the first via V1 to the seventh via V7 so that a plurality of vias may be in contact with the upper surface and the lower surface of the thermally conductive structure 110. Area of the upper surface and the lower surface of the thermally conductive structure 110 may be larger than that of vias and the volume may be twice greater than that of the vias. Thus, the thermally conductive structure 110 may absorb heat rapidly from a heat source and disperse it through other paths that are connected to the thermally conductive structure 110. A distance between the thermally conductive structure 110 and a hot spot may decrease to shorten the transferring time of heat from the hot spot to the thermally conductive structure 110 as the thickness of the thermally conductive structure 110 increases.

In an example, a first electronic component 500 may be formed on one surface of a circuit board 100. The circuit board 100 may be formed on one surface of an additive substrate 800 such as a main board. The first electronic component 500 may be an electronic component such as an application processor and may generate heat during operation.

Heat may be generated as the first electronic component 500 operates. There may be a region with high temperature due to relatively more heat being generated. This region may be called as a hot spot. This hot spot may be formed in a certain area in the circuit board 100, for example, at all or a part of the first electronic component 500. The hot spot may be also formed in a relatively denser region such as, for example, near a power terminal or a switch of the first electronic component 500.

The first electronic component 500 may include both a region with relatively high performance and a region with relatively low performance. For example, a processor connected with cores with a clock speed of 1.8 GHz and a processor connected with cores with a clock speed of 1.2 GHz may be mounted in different regions of the first electronic component 500. Referring to FIG. 6, in an embodiment, the first electronic component 500 may include a first unit area 510 and a second unit area 520. The first unit area 510 may operate faster than the second unit area 520. Thus, the first unit area 510 may use more power and generate more heat than the second unit area 520.

In a circuit board 100, the thermally conductive structure 110 may be positioned at an area adjacent to a hot spot. Thus, the heat generated from the hot spot may be rapidly distributed to other regions of the circuit board 100 or other devices such as a main board, for example, an additive substrate 800 in FIG. 1, to which the circuit board 100 is connected.

In an example, at least a part of the thermally conductive structure 110 may be positioned at a vertically downward region.

The circuit board 100 according to an example may include a second electronic component 200. Examples of the second electronic component 200 may include a capacitor, an inductor, or a resistor.

When the first electronic component 500 is an application processor, a capacitor may be connected with the application processor to reduce power noise. As the distance between the capacitor and the application processor decreases, the power noise decreases. Therefore, at least a part of the second electronic component 200 may be positioned at a vertically downward region from the first electronic component 500 to reduce power noise.

In an example, most of the thermally conductive structure 110 may be positioned at a vertically downward region from the first electronic component 500. An area of the upper surface of the thermally conductive structure 110 may be smaller than that of the upper surface of the first electronic component 500. The area of the upper surface of the thermally conductive structure 110 may correspond to the width of the hot spot of the first electronic component 500.

Thus, the heat from the hot spot may move rapidly to the thermally conductive structure 110. It may be also advantageous to reduce warpage and weigh of the circuit board 100. Furthermore, efficiency may be improved in the process for arranging the thermally conductive structure 110 in the circuit board 100.

Most of the second electronic component 200 may be positioned at a vertically downward region from the first electronic component 500. The second electronic component 200 may be positioned at a region, where the thermally conductive structure 110 is not positioned, of the vertically downward region from the first electronic component 500. The thermally conductive structure 110 may be positioned at a region closer to the hot spot, compared to the second electronic component 200.

Referring to FIG. 1, the thermally conductive structure 110 and the second electronic component 200 may be inserted inside cavities C1 and C2 in the core 10. The thermally conductive structure 110 may be inserted to the first cavity C1 and the second electronic component 200 may be inserted to the second cavity C2. The thermally conductive structure 110 and the second electronic component 200 may be arranged to be adjacent to each other at a vertically downward region from the first electronic component 500. In particular, the thermally conductive structure 110 may be arranged intensively around the hot spot as shown in FIG. 6.

FIG. 7 illustrates an example of a flat shape where the insulating part 120 does not include the core 10. Thus, it may maximize reduction of power noise and also distribute heat from the hot spot rapidly.

In an example, the first electronic component 500 may be combined to the circuit board 100 by a solder S. The first electronic component 500 may be combined with the first metal pattern 131, the third metal pattern 133, and the seventh metal pattern 134 by the solder S. A second metal pattern 141, a fourth metal pattern 142, a fifth metal pattern 143, a sixth metal pattern 144 and the like of the circuit board 100 may be connected to the additive substrate 800 in the main board by the solder S.

In an example, a third thermally conductive structure L1, which is formed of a material similar to and is of a similar shape to the thermally conductive structure 110, may be formed, instead of the solder S, between the second metal pattern 141 and the additive substrate 800. Thus, the second metal pattern 141 and the additive substrate 800 may be connected using the third thermally conductive structure L1, which is made in a lump shape and made of a material having higher thermal conductivity than the solder S, in order to rapidly transfer heat from the thermally conductive structure 110 to the additive substrate 800. A heat sink L2 may be formed in the additive substrate 800 to distribute or spread heat from the third thermally conductive structure L1. The heat sink L2 may be exposed to upper surface of the additive substrate 800. It may be also exposed to the lower surface of the additive substrate 800 to improve heat distribution.

The heat may transfer rapidly from the hot spot to the additive substrate 800 through the first metal pattern 131—the first via V1—thermally conductive structure 110—the second via V2—the second metal pattern 141. Since the first structure 112 and the second structure 113 may be insulated from each other by the structure insulating part 114, electrical signals passing through a path of the first contact via Vc1—the first structure 112—the third contact via Vc3 may be different from those passing through a path of the second contact via Vc2—the second structure 113—the fourth contact via Vc4. That is, the heat generated from the first electronic component 500 may transfer through the thermally conductive structure 110 and the signals outputted from or inputted to the first electronic component 500 may also transfer through the thermally conductive structure 110. The thermally conductive structure 110 may be thus used to transmit signals in addition to distribute heat so that it may provide better space efficiency and design freedom, which further contributes to minimize the size of the circuit board, compared to that the thermally conductive structure 110 is used only to distribute heat.

When the first to the seventh metal patterns are formed to expose to the external surface of the insulating part 120 as shown in FIG. 1, the first to the seventh metal patterns may function as contact pads. A part of the metal patterns may be exposed and a solder resist layer may be formed to protect the other part of the metal patterns and the insulating part 120 even though it is not shown. Various surface treatment layers such as, for example, a nickel-gold plating layer may be further formed on the surface of the exposed metal patterns.

When a terminal that is connected to the first metal pattern 131 is a terminal for transmitting and receiving signals among terminals of the first electronic component 500, the path including the first via V1, the thermally conductive structure 110, the second via V2, and the second metal pattern 141 may function for signal transmission. Here, a contact pad or a terminal of the additive substrate 800 which is connected to the second metal pattern 141 may also function for signal transmission.

When a terminal which is connected to the first metal pattern 131 is not a terminal for transmitting and receiving signals among terminals of the first electronic component 500, the path including the first via V1, the thermally conductive structure 110, the second via V2, and the second metal pattern 141 may be electrically connected to a ground terminal, which is not shown. Here, a contact pad or a terminal of the additive substrate 800 which is connected to the second metal pattern 141 may be also electrically connected to the ground terminal which is not shown. The ground terminal may be mounted in at least one of the circuit board 100 and the additive substrate 800.

When a terminal, which is connected to the first metal pattern 131, is a power terminal among terminals of the first electronic component 500, the path including the first via V1, the thermally conductive structure 110, the second via V2, and the second metal pattern 141 may be electrically connected to a power supply circuit, which is not shown. A contact pad or a terminal of the additive substrate 800, which is connected to the second metal pattern 141 may also be electrically connected to the power supply circuit, which is not shown. The power supply circuit may be mounted in at least one of the circuit board 100 and the additive substrate 800.

A terminal which is connected to the first metal pattern 131 may be a dummy terminal. This dummy terminal may only function as a path to transfer heat from the first electronic component 500 to the outside of the component 500.

Referring to FIG. 1, the circuit board 100 may include the core 10. The core 10 may reduce problems caused for warpage by reinforcing the rigidity. The core 10 may include a material having high thermal conductivity to rapidly distribute heat generated from a localized region such as the hot spot to other parts of the circuit board 100 so that problems caused for overheating may be alleviated.

A first upper insulation layer 121 may be formed on the upper surface of the core 10 and a first lower insulation layer 121' may be formed on the lower surface of the core 10. As shown in FIG. 2, a second upper insulation layer 122 and a second lower insulation layer 122' may also be formed.

In an example, the core 10 may include a second thermally conductive structure (not shown). For example, the core 10 may include a first core layer 11, which is composed of graphite or graphene. The graphite may have very high thermal conductivity in a XY plane direction to distribute heat efficiently and rapidly.

In an example, the second thermally conductive structure may be directly in contact with the surface of the thermally conductive structure 110. For example, the surface of the second thermally conductive structure may be exposed to the first cavity C1 in the core 10 and the thermally conductive structure 110 may be in contact with the first cavity C1. In another example, a material with high thermal conductivity may be used in a region between the second thermally conductive structure and the thermally conductive structure 110. Here, the material with high thermal conductivity may be a thermal interface material (TIM). The TIM may include materials such as, for example, a polymer-metal composite material, a ceramic composite material and a carbon-based composite material, a mixed material of epoxy and a carbon fiber filler (thermal conductivity about 660 W/mk), silicon nitride ($Si_3N_4$, thermal conductivity about 200~320 W/mk), and epoxy and boron nitride; (BN, thermal conductivity about 19 W/mk). Thus, the heat transferred to the thermally conductive structure 110 may be rapidly distributed to a vertical direction and a horizontal direction through the second thermally conductive structure.

When the thermally conductive structure 110 and the second thermally conductive structure are directly in contact each other or are connected through the TIM, heat may be dispersed more rapidly, compared to when the heat is transferred only downward after it is transferred from the first electronic component 500 to the thermally conductive structure 110. In addition, as heat is evenly distributed throughout the circuit board 100, temperature deviation of each component and element mounted on the circuit board 100 may be reduced to improve reliability. As heat is rapidly distributed throughout the circuit board 100, the circuit board 100 functions as a heat sink to increase a radiant heat area.

In an example, a first circuit pattern P1 and a second circuit pattern P2 may be formed on the surfaces of the core 10. The first circuit pattern P1 and the second circuit pattern P2 may be electrically connected through vias TV, which pass through the core 10. The first circuit pattern P1 may be connected with the third metal pattern 133 through the fourth via V4, and the second circuit pattern P2 may be connected with the fourth metal pattern 142 through the fifth via V5. The third metal pattern 133 may be connected with the first electronic component 500 through the solder S, and the fourth metal pattern 142 may be connected with the contact pad 810 of the additive substrate 800 through the solder S. Thus, a path may be provided for transmitting and receiving electrical signals between the first electronic component 500 and the additive substrate 800.

A second core layer 12 may be formed on one surface of the first core layer 11 and a third core layer 13 may be formed on the other surface of the first core layer 11. In an example, at least one of the second core layer 12 and the third core layer 13 may be composed of an insulating material such as PPG (prepreg). In another example, the second core layer 12 and the third core layer 13 may be composed of a metal such as copper or invar. In another example, the first core layer 11 may be composed of invar and the second core layer 12 and the third core layer 13 may be composed of copper. When at least one of the second core layer 12 and the third core layer 13 may be composed of a conductive material, signals may be transmitted to an unintended path due to the first circuit pattern P1 or the second circuit pattern P2 formed on the surface of the core 10. Thus, a part may be formed on the surface of the core 10 in order to ensure the dielectric property.

In an example, the second electronic component 200 may be inserted into the second cavity C2 of the core 10. The second electronic component 200 may be connected with the seventh metal pattern 134 through a sixth via V6 and may also be connected with the sixth metal pattern 144 through a seventh via V7. The second electronic component 200 may be a passive element such as, for example, an inductor or a capacitor. The second electronic component 200 may be an active element such as, for example, an IC (integrated circuit). When the second electronic component 200 is a capacitor, a terminal of the first electronic component 500, which is connected with the seventh metal pattern 134, may be a power terminal. That is, the second electronic component 200 may be mounted as a decoupling capacitor to reduce power noise of the first electronic component 500.

The power noise decreases as distance between the second electronic component 200 and the first electronic component 500 shortens. Thus, at least a part of the second electronic component 200 may be arranged at a vertically downward region from the first electronic component 500 in the circuit board 100 according to an example.

In another example (not shown in the Figures), a recess part may be formed instead of the cavity, which passes through the core 10 and the thermally conductive structure 110 or the second electronic component 200 may be inserted to the recess part.

Referring to FIG. 1, a thickness of the thermally conductive structure 110 may increase from the lower surface of the second circuit pattern P2 to the upper surface of the first circuit pattern P1. The upper surface of the thermally conductive structure 110 may be positioned closer to the upper surface of the circuit board 100 than the upper surface of the first circuit pattern P1. Thus, a heat capacity of the thermally conductive structure 110 may be increased to absorb more heat. A distance between the thermally conductive structure 110 and the hot spot may be reduced to shorten the heat transfer time from the hot spot to the thermally conductive structure 110.

In an example, the lower surface of the thermally conductive structure 110 may be positioned on the same horizontal surface as the lower surface of the second circuit pattern P2. Here, the thickness of the thermally conductive structure 110 may be thicken from the lower surface of the second circuit pattern P2 to the upper surface of the first circuit pattern P1 to increase the heat capacity of the thermally conductive structure and to shorten the distance to the hot spot.

In another example (not shown in the Figures), the upper surface of the thermally conductive structure 110 may be positioned at the same horizontal surface as the upper surface of the first circuit pattern P1. Here, the thickness of the thermally conductive structure 110 may be thicken from the lower surface of the second circuit pattern P2 to the upper surface of the first circuit pattern P1 to increase the heat capacity of the thermally conductive structure.

When the structure described above is implemented as actual products, various variations may be caused in the manufacturing process. For example, both sides of the core may not be complete planes, thickness between circuit patterns may be different during forming circuit patterns on the core. Therefore, it is to be appreciated that realistic process variations may be taken into account in interpretation of the scope of the present disclosure. It is also to be appreciated that a certain extent of warpage may be caused during manufacturing the circuit boards due to demands for electronic devices with smaller sizes and thinner wiring patterns. Accordingly, the circuit board according to the present disclosure may allow a certain extent of the warpage that may be determined depending of the thickness and/or position of the thermally conductive structure 110.

Referring to FIG. 2, a second upper insulation layer 122 may be formed on the first upper insulation layer 121. Height of the first via V1 or the second via V2, which is formed between the external surface of the circuit board 100 and the thermally conductive structure 110, may be shorter than that of the via (V4', V5'), which connects between the external surface of the circuit board 100 and inner layer patterns P1', P2', to increase both the heat capacity and the heat distribution of the thermally conductive structure 110. The upper surface of the thermally conductive structure may be covered with the first upper insulation layer. One surface of the via, of which the other surface is in contact with the thermally conductive structure, may be in contact with the circuit pattern formed on the first upper insulation layer. Another via which passes through the second upper insulation layer may be connected with the first electronic component through another circuit pattern formed on the second upper insulation layer and the solder. That is, the number of build-up layers, which may be formed on the thermally conductive structure 110 may be determined as needed. In terms of the heat capacity, the greater the thickness of the thermally conductive structure the better.

Thermally conductive structure 110 included in the circuit board 100 may further include an adhesion improving part or adhesive part to improve adhesion with the insulating part 120.

When the surface of the thermally conductive structure 110 is directly in contact with the insulating part 120, it may cause a gap between the thermally conductive structure 110 and the insulating part 120 during the reflow process or the solder pot process, in a phenomenon called delamination. A primer layer 111 may be further formed on the surface of the thermally conductive structure 110 to improve the adhesion with the insulating part 120. In an example, the primer layer 111 may be made of a primer, such as, for example, isopropyl alcohol and acrylic silane. In another example, the primer layer 111 may be composed of 3-(trimethoxysilyl) propylmethacrylate (MPS) and may further include a silane-based additive.

Figure 9A:
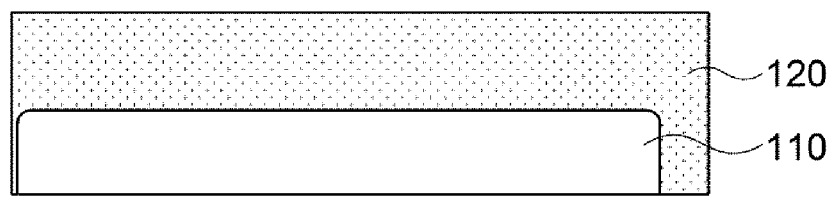
FIG. 9A is a diagram illustrating an example of a reflow test result when it is performed in a primer layer formed on the surface of the thermally conductive structure.
Figure 9B:
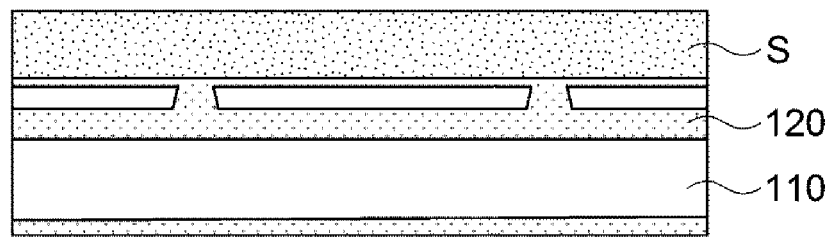
FIG. 9B is a diagram illustrating an example of a solder pot test result when it is performed in a primer layer formed on the surface of the thermally conductive structure.
Figure 10A:
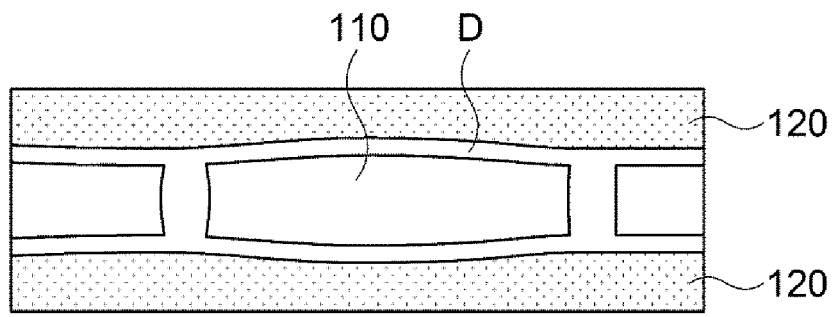
FIGS. 10A-10C are diagrams illustrating examples of reflow test result when it is performed in an insulating part directly contacted with the thermally conductive structure.
Figure 10B:
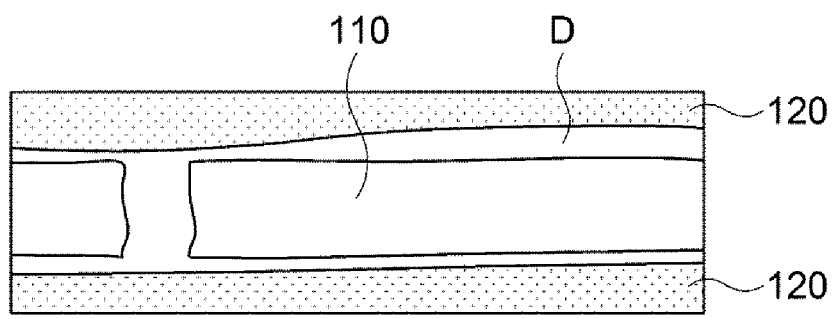
Figure 10C:
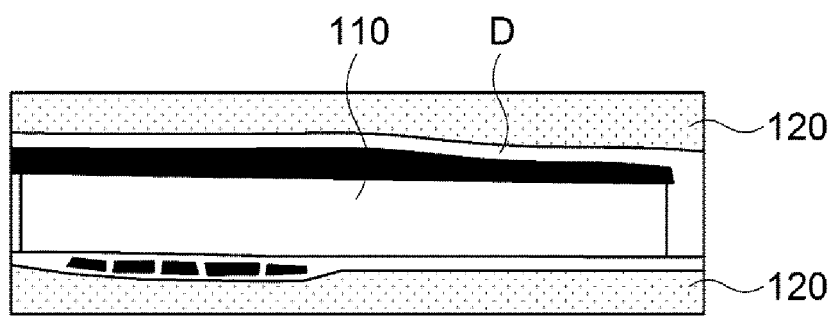
Figure 10D:
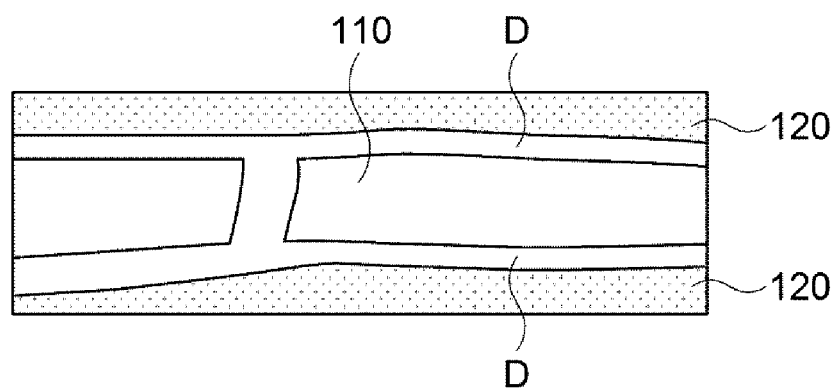
FIGS. 10D-10E are diagrams illustrating examples of a solder pot test result when it is performed in an insulating part directly contacted with the thermally conductive structure.
Figure 10E:
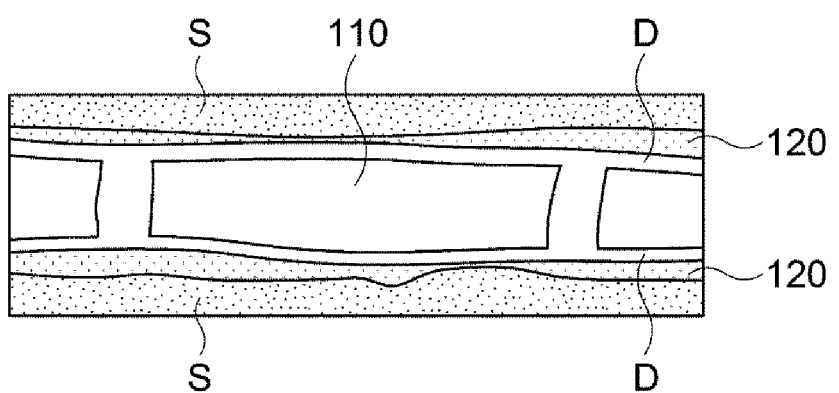

FIG. 9A is a schematic view illustrating a reflow test result when it is performed in the primer layer 111 formed on the surface of the thermally conductive structure and FIG. 9B is a schematic view illustrating a solder pot test result when it is performed in the primer layer 111 formed on the surface of the thermally conductive structure. FIGS. 10A-10C are schematic views illustrating a reflow test result when it is performed in the insulating part 120 directly contacted with the thermally conductive structure. FIGS. 10D-10E are schematic views illustrating a solder pot test result when it is performed in the insulating part 120 directly contacted with the thermally conductive structure.

Referring to FIG. 9A to FIG. 10E, a gap D between the thermally conductive structure and the insulating part 120 during the reflow process or the solder pot process when there is no primer layer 111. When the primer layer 111 is formed on the surface of the thermally conductive structure, it may improve the adhesion between the thermally conductive structure and the insulating part 120. Here, the thermally conductive structure may be at least one of the thermally conductive structure 110 and the second thermally conductive structure.

The adhesion between the thermally conductive structure 110 and the insulating part 120 may be improved by performing a surface treatment such as blackening and roughening on the surface of the thermally conductive structure 110.

When the surface of the thermally conductive structure 110 is surface-treated, it may cause problems during the manufacturing process. For example, color of the thermally conductive structure 110 may vary due to the surface treatment. In this case, an automated device, which includes the thermally conductive structure 110 on the insulating part 120, may cause frequent errors in the process of recognizing the thermally conductive structure 110.

Accordingly, the circuit board 100 may reduce the delamination between the thermally conductive structure 110 and the insulating part 120.

Referring to FIG. 1 again, when the primer layer 111 is formed on the surface of the thermally conductive structure 110, the first via V1 or the second via V2 may be directly in contact with the thermally conductive structure 110 through the primer layer 111. Thus, it may minimize reduction in heat distribution performance and signal transmission performance due to the primer layer 111. Here, the thickness of the primer layer 111 may be exaggerated in order to help in understanding of the primer layer 111 in the Figures. The primer layer 111 may be formed in a thin film of which thickness is much thinner than that shown in the Figures.

The lower surface of the primer layer 111 is represented to be positioned at the same plane as the second circuit pattern P2 and thus the lower surface of the thermally conductive structure 110 is represented to be positioned slightly higher than the second circuit pattern P2. However, the thickness of the primer layer 111 may be much thinner than that of the second circuit pattern P2 or the thermally conductive structure 110 so that the thickness of the primer layer 111 may be ignored in understanding the positional relationship of the thermally conductive structure 110 and the second circuit pattern P2.

DESCRIPTION OF REFERENCE NUMERALS

100: Circuit board
110: Thermally conductive structure
111: Primer layer
112: First structure
113: Second structure
114: Structure insulating part 120: Insulating part
121: First upper insulation layer
121': First lower insulation layer
122: Second upper insulation layer
122': Second lower insulation layer
131: First metal pattern
133: Third metal pattern
134: seventh Metal pattern
141: Second metal pattern
142: fourth Metal pattern
143: fifth Metal pattern
144: sixth Metal pattern
S: Solder
200: Second electronic component
V1: First via
Vc1: the first contact via
Vc2: the second contact via
V2: Second via
Vc3: the third contact via
Vc4: fourth Contact via
V4: fourth via
V5: fifth Via
V6: sixth Via
V7: seventh Via
10: Core
11: First core layer
12: Second core layer
13: Third core layer
P1: First circuit pattern
P2: Second circuit pattern
TV: Through via
500: First electronic component
800: Additive substrate
810: Contact pad
L1: Third thermally conductive structure
L2: Heat sink
C1: First cavity
C2: Second cavity While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

The invention claimed is:

1. A circuit board comprising:
an insulating part;
a thermally conductive structure comprising a first structure and a second structure; and
an insulator configured to insulate the first structure from the second structure, wherein the first structure and the second structure are composed of thermally conductive material, a part of the thermally conductive structure is inserted to the insulating part, and the second structure transfers signals to or from an electronic component disposed above the thermally conductive structure, and a first contact via in contact with the first structure is thermally insulated from a second contact via in contact with the second structure.

2. The circuit board of claim 1, further comprising an adhesive part formed on a surface of the thermally conductive structure, the adhesive part being configured to increase adhesion between the thermally conductive structure and the insulating part.

3. The circuit board of claim 2, wherein the adhesive part is composed of a primer comprising acrylic silane.

4. The circuit board of claim 1, wherein the insulator comprises glass fiber.

5. The circuit board of claim 1, further comprising:
the first contact via configured to contact with an upper surface of the first structure;
the second contact via configured to contact with an upper surface of the second structure;
a third contact via configured to contact with a lower surface of the first structure; and
a fourth contact via configured to contact with a lower surface of the second structure.

6. The circuit board of claim 5, further comprising:
a first signal transmission path comprising the first contact via, the first structure, and the third contact via;
a second signal transmission path comprising the second contact via, the second structure, and the fourth contact via; and
the first signal transmission path and the second signal transmission path being insulated from each other.

7. The circuit board of claim 1, wherein the thermally conductive structure is disposed adjacent to a hot spot.

8. The circuit board of claim 1, further comprising:
a second electrical component disposed adjacent to the thermally conductive structure
to reduce a power noise.

* * * * *